(12) United States Patent
Lin

(10) Patent No.: US 9,728,883 B1
(45) Date of Patent: Aug. 8, 2017

(54) ELECTRICAL CONNECTOR REDUCING INSERTION LOSS WHILE ENSURING TERMINAL FIXING HEIGHT

(71) Applicant: LOTES CO., LTD, Keelung (TW)

(72) Inventor: Chin Chi Lin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/270,143

(22) Filed: Sep. 20, 2016

(30) Foreign Application Priority Data

Jul. 27, 2016 (CN) .................... 2016 2 0793008 U

(51) Int. Cl.
*H01R 13/405* (2006.01)
*H01R 12/58* (2011.01)
*H01R 12/73* (2011.01)
*H05K 1/02* (2006.01)
*H05K 7/20* (2006.01)
*H01R 12/50* (2011.01)

(52) U.S. Cl.
CPC .......... *H01R 13/405* (2013.01); *H01R 12/585* (2013.01); *H01R 12/737* (2013.01); *H01R 23/7057* (2013.01); *H05K 1/0203* (2013.01); *H05K 7/20* (2013.01)

(58) Field of Classification Search
CPC H01R 12/585; H01R 13/405; H01R 23/7057; H05K 1/0203; H05K 7/20
USPC ................................ 439/736, 82, 487, 751
See application file for complete search history.

(56) References Cited

U.S. PATENT DOCUMENTS 9,548,571 B2 * 1/2017 Deng ................. H01R 13/6581
2011/0263158 A1 * 10/2011 Nishikata ............. H01R 13/405
439/626

\* cited by examiner

*Primary Examiner* — Abdullah Riyami
*Assistant Examiner* — Justin Kratt
(74) *Attorney, Agent, or Firm* — Locke Lord LLP; Tim Tingkang Xia, Esq.

(57) ABSTRACT

An electrical connector includes an insulating body having a first insulator and a second insulator, and multiple terminals disposed on the insulating body. A gap space is formed between the first and second insulators. The gap space is filled with air. Each terminal has a mating segment located above the first insulator, a first fixing segment extending downward from the mating segment and insert-molded into the first insulator, a connecting segment extending downward from the first fixing segment and exposed to the gap space, a second fixing segment extending downward from the connecting segment and insert-molded into the second insulator, and a positioning segment extending downward from the second fixing segment and located below the second insulator. The width of the first and second fixing segment is less than the width of at least one of the mating segment, the connecting segment and the positioning segment.

9 Claims, 7 Drawing Sheets

ELECTRICAL CONNECTOR REDUCING INSERTION LOSS WHILE ENSURING TERMINAL FIXING HEIGHT

CROSS-REFERENCE TO RELATED APPLICATION

This non-provisional application claims priority to and benefit of, under 35 U.S.C. §119(a), Patent Application No. 201620793008.2 filed in P.R. China on Jul. 27, 2016, the entire content of which is hereby incorporated by reference.

FIELD OF THE INVENTION

The present invention relates generally to an electrical connector, and more particularly to an electrical connector adapted to transmit high frequency signals.

BACKGROUND OF THE INVENTION

At present, with continuous improvement of signal transmission rate, design requirements for the electrical connector are also continuously increasing.

For example, an electrical connector in the Chinese Patent Application No. CN201420690150.5 includes an insulating body and multiple pairs of differential signal sheets. Each pair of differential signal sheets include a rubber core and two signal terminals each insert-molded into the rubber core. Each of the signal terminals has a fixing segment insert-molded into the rubber core and a mating segment not wrapped by the rubber core. The fixing segment has a first section connected with the mating segment. The width of the first section is less than that of the mating segment, so that impedances of the first section and the part of the mating segment connected therewith can be adjusted to be substantially the same.

However, as the length of the first section of the signal terminal is greater and the width of the first section is thinner, such a structure causes the resistance of the slender first section to increase, plus physical characteristics of the rubber core, insertion loss is greater when the signals are transmitted in the first section in the rubber core, and the performance of high frequency signal transmission of the electrical connector is affected.

Therefore, a heretofore unaddressed need exists in the art to address the aforementioned deficiencies and inadequacies.

SUMMARY OF THE INVENTION

In one aspect, the present invention relates to an electrical connector which can reduce insertion loss while ensuring the fixing height of the terminals.

In certain embodiments, an electrical connector includes an insulating body and multiple terminals disposed on the insulating body. The insulating body includes a first insulator and a second insulator. There is a gap space located between the first insulator and the second insulator. The gap space is filled with air. Each of the terminals has a mating segment located above the first insulator. The mating segment extends downward to form a first fixing segment insert-molded into the first insulator. The first fixing segment extends downward to form a connecting segment exposed to the gap space. The connecting segment extends downward to form a second fixing segment insert-molded into the second insulator. The second fixing segment extends downward to form a positioning segment located below the second insulator. The width of the first fixing segment and the width of the second fixing segment are less than the width of at least one of the mating segment, the connecting segment and the positioning segment.

In certain embodiments, multiple through holes are disposed through the first insulator and/or the second insulator respectively which are respectively located between two adjacent terminals. The multiple terminals are arranged in two rows, and multiple through holes are respectively disposed through the first insulator and/or the second insulator which are respectively located between two adjacent terminals in the same row. A first transition segment with increasing width extends from each of two ends of the first fixing segment, and a first linear segment further extends from each first transition segment. The two first linear segments are respectively connected with the mating segment and the connecting segment. The width of the first linear segment is greater than the width of the first transition segment and the width of the first fixing segment, and the height of the first linear segment insert-molded into the first insulator is greater than 0.01 millimeter (mm). A second transition segment with increasing width extends from each of two ends of the second fixing segment, and a second linear segment further extends from each second transition segment. The two second linear segments are respectively connected with the positioning segment and the connecting segment. The width of the second linear segment is greater than the width of the second transition segment and the width of the second fixing segment, and the height of the second linear segment insert-molded into the second insulator is greater than 0.01 mm.

In certain embodiments, the width of the first fixing segment and the width of the second fixing segment are both less than the width of the connecting segment, the width of the mating segment is greater than the width of the first fixing segment, and the width of the positioning segment is greater than the width of the second fixing segment.

In certain embodiments, the insulating body further includes a third insulator connecting the first insulator and the second insulator, and the first insulator, the second insulator and the third insulator are integrally formed and enclose the gap space.

In certain embodiments, the first insulator and the second insulator are disposed separately.

Compared with the related art, in certain embodiments of the present invention, the width of the first and second fixing segments fixed into first and second insulators become small, a connecting segment between them is exposed to the air, while the fixing height of the terminals is ensured to be sufficient to firmly fix the terminals, the tapered parts of the terminals, that is, the length of the first and second fixing segments, are shortened, to reduce the resistance of the first and second fixing segments, and in addition, mediums around the terminals are mostly the air, therefore, insertion loss can be reduced, and high frequency performance of the electrical connection is optimized.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
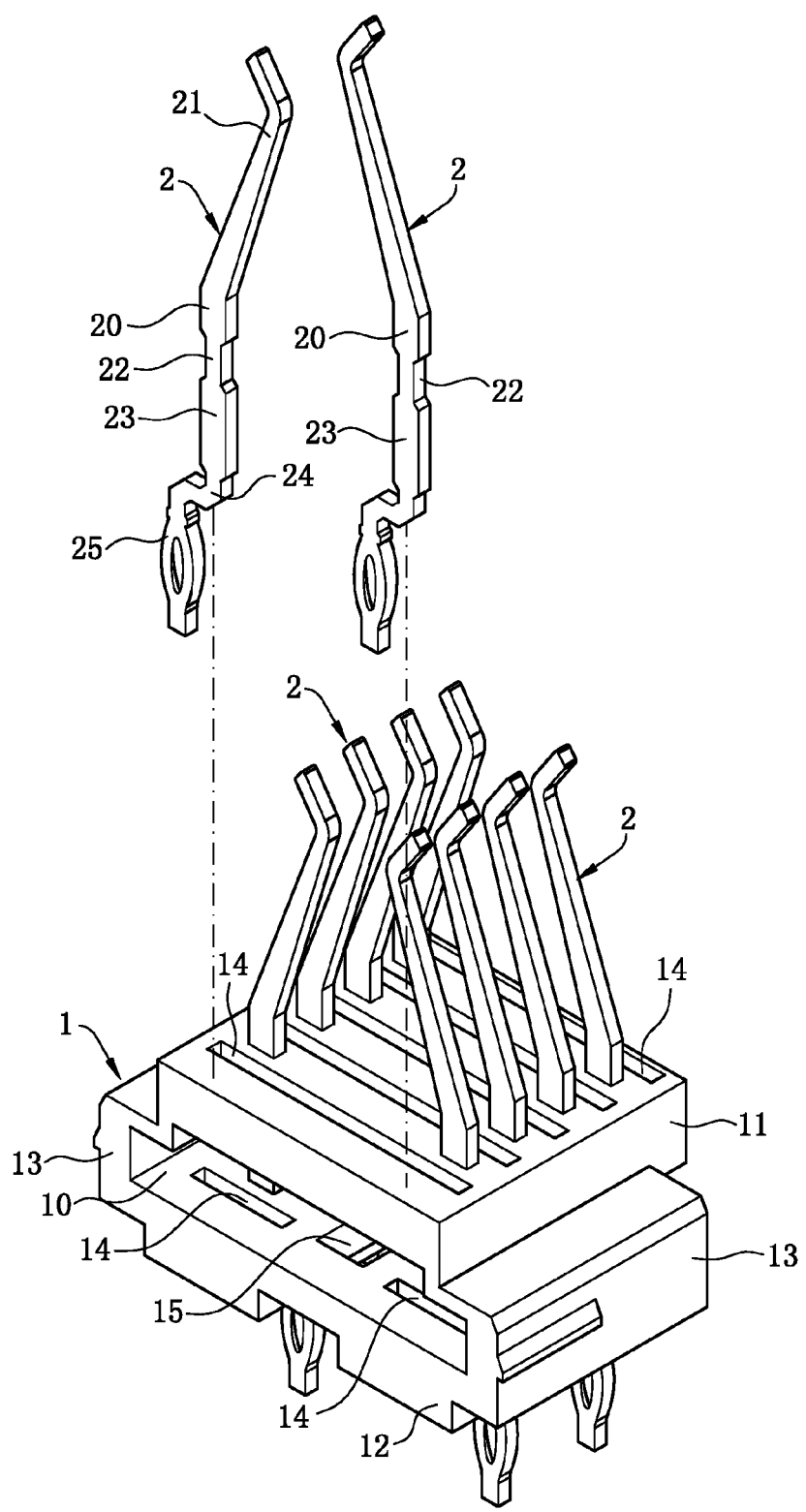
FIG. 1 is a schematic three-dimensional exploded view of a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to an electrical connector.

FIGS. 1-6 illustrate a first embodiment of the present invention. In this embodiment, the electrical connector is a SLOT type connector, in other embodiments, the electrical connector may also be a SOCKET type connector, and the present invention is not limited thereto.

Figure 4:
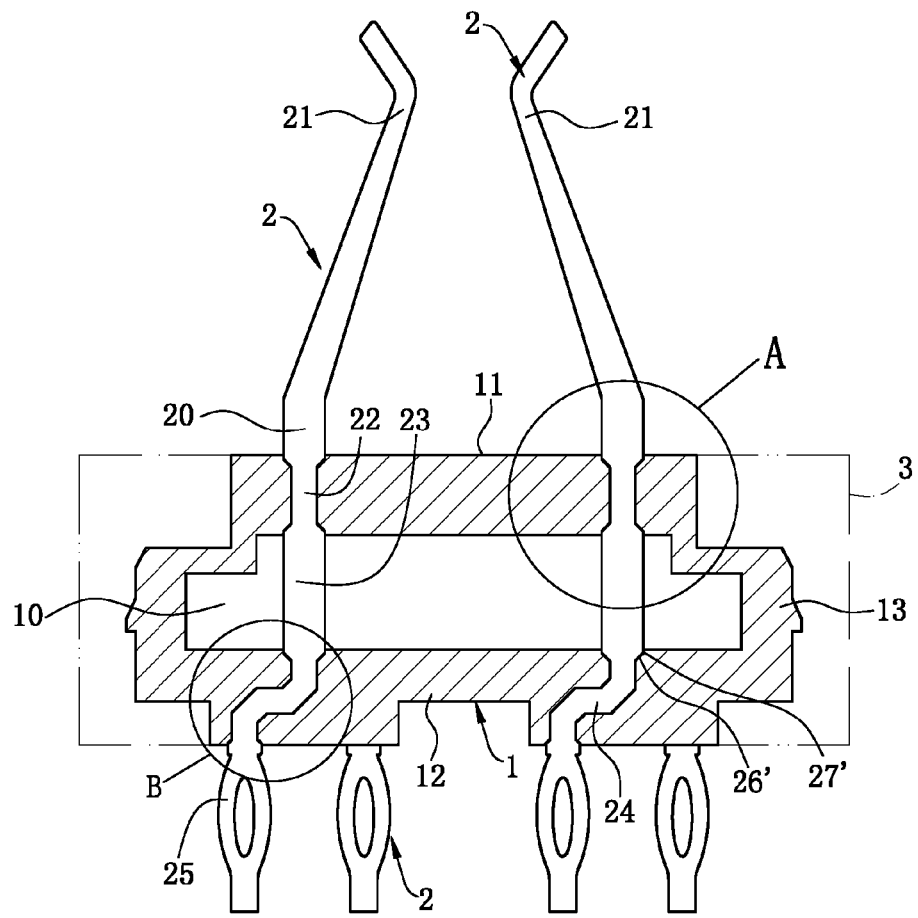
FIG. 4 is a sectional view of the first embodiment of the present invention.

As shown in FIGS. 1 and 4, the electrical connector includes an insulating body 1 and multiple terminals 2 insert-molded into the insulating body 1 for transmitting high speed signals, and the insulating body 1 and the multiple terminals 2 are wholly assembled into a body 3.

Figure 2:
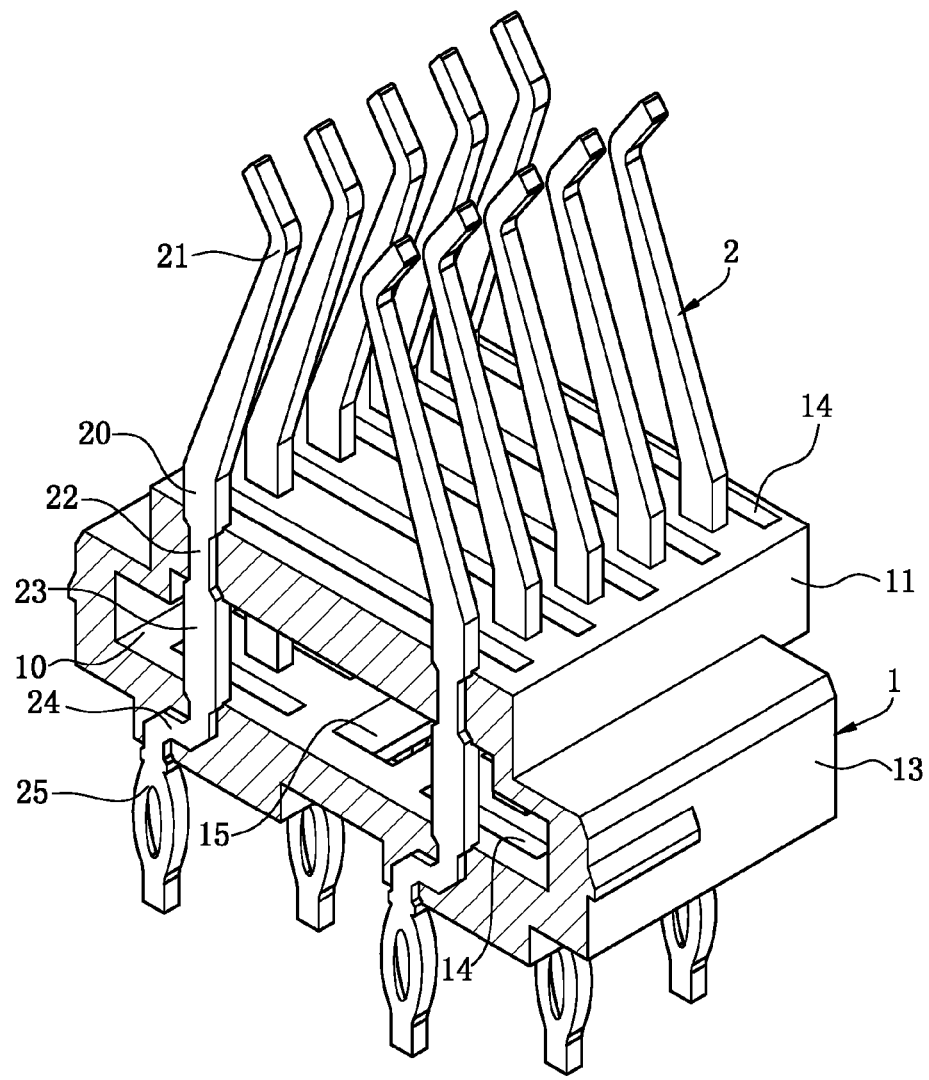
FIG. 2 is a sectional view of the first embodiment of the present invention.
Figure 3:
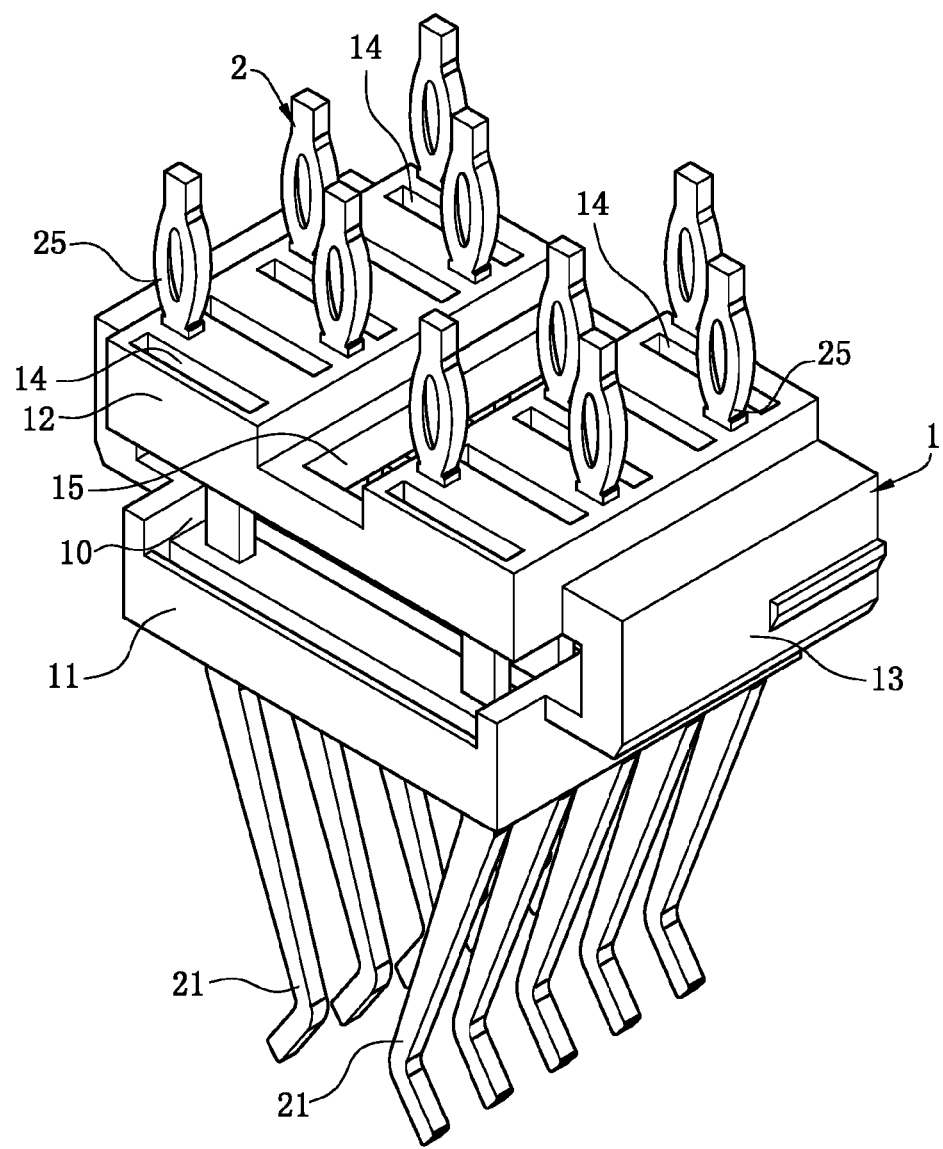
FIG. 3 is a schematic inverted three-dimensional view of the first embodiment of the present invention.

As shown in FIGS. 1-3, the insulating body 1 is made of a plastic material. The insulating body 1 includes a first insulator 11 and a second insulator 12 arranged up and down. There is a gap space 10 formed between the first insulator 11 and the second insulator 12, and the gap space 10 is filled with air. The insulating body 1 further includes a third insulator 13 connecting the first insulator 11 and the second insulator 12. In this embodiment, the first insulator 11, the second insulator 12 and the third insulator 13 are integrally formed and enclose the gap space 10.

The first insulator 11 and the second insulator 12 are respectively provided with multiple through holes 14 running from top to bottom which are respectively located between two adjacent terminals 2. Specifically, as shown in FIGS. 2 and 3, the multiple terminals 2 are arranged in two rows, two adjacent terminals 2 in the same row are disposed with one of the through holes 14 therebetween, and two adjacent terminals 2 in different rows also have one of the through holes 14 therebetween. In this embodiment, a through slot 15 is disposed through the second insulator 12, which is located between two rows of the terminals 2. That is, the multiple through holes 14 between two adjacent terminals 2 in different rows are in communication with each other to form a through slot 15. In this way, plastic between the two terminals 2 is hollowed, and a through hole 14 is disposed between two adjacent terminals 2, which can reduce coupling between the adjacent terminals 2 and regulate impedance, to achieve impedance matching. In other embodiments, for example, in a SOCKET type connector where the multiple terminals 2 are matrix-arranged, it is also possible that through holes 14 are disposed around each terminal 2, so that any two adjacent terminals 2 are separated by the through hole 14.

Figure 5:
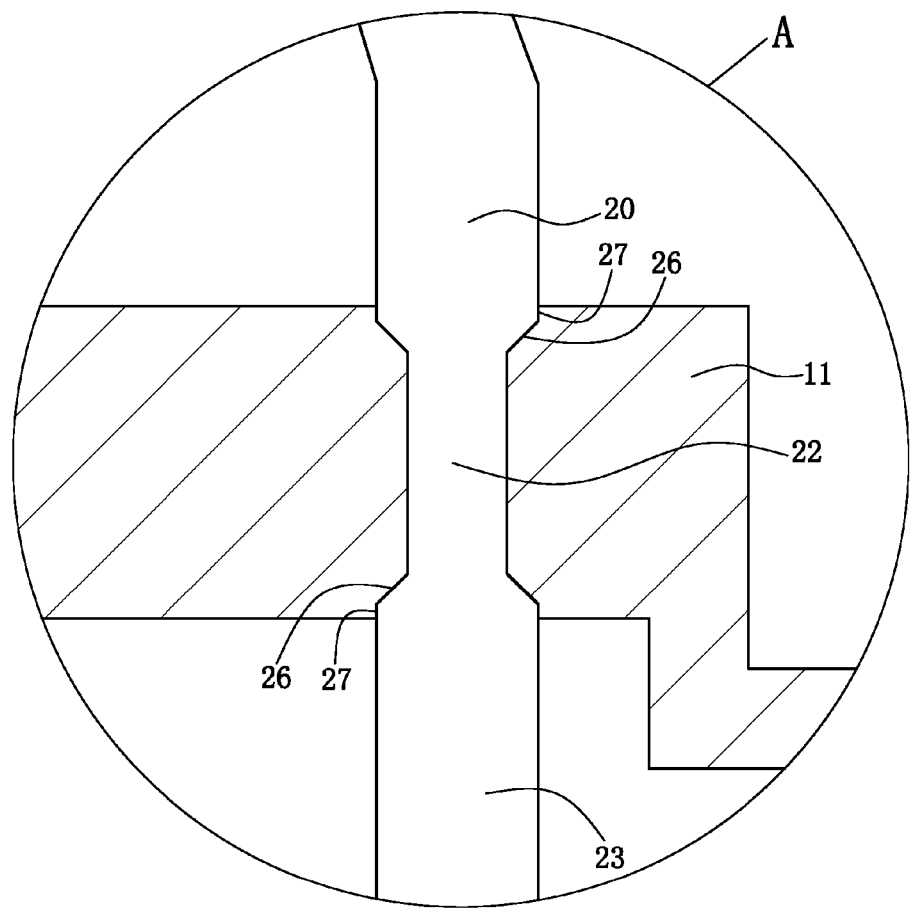
FIG. 5 is an enlarged view of the part A of FIG. 4.

As shown in FIGS. 2, 4 and 5, each terminal 2 has a mating segment 20 located above the first insulator 11. The mating segment 20 bends and extends upward to form a contact arm 21 used to contact an external element (not shown). The mating segment 20 extends downward to form a first fixing segment 22 which is insert-molded into the first insulator 11. The first fixing segment 22 extends downward to form a connecting segment 23 which is exposed to the gap space 10. The connecting segment 23 extends downward to form a second fixing segment 24 which is insert-molded into the second insulator 12. The second fixing segment 24 extends downward to form a positioning segment 25 which is located below the second insulator 12, and the positioning segment 25 is used to electrically connect to a circuit board (not shown). The width of the first fixing segment 22 and the width of the second fixing segment 24 are less than the width of at least one of the mating segment 20, the connecting segment 23 and the positioning segment 25.

Figure 6:
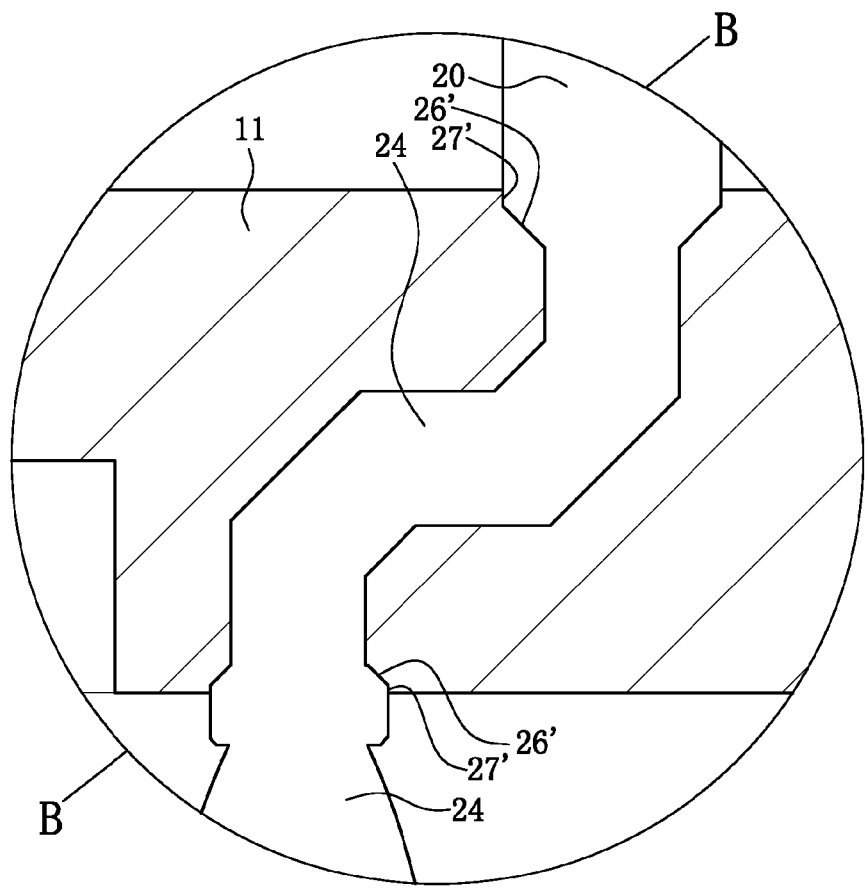
FIG. 6 is an enlarged view of the part B of FIG. 4.

Specifically, referring to FIGS. 4-6, a first transition segment 26 with increasing width extends from each of two ends of the first fixing segment 22. A first linear segment 27 further extends from each first transition segment 26. The two first linear segments 27 are respectively connected with the mating segment 20 and the connecting segment 23. The width of the first linear segment 27 is greater than the width of the first transition segment 26 and the width of the first fixing segment 22, and the height of the first linear segment 27 insert-molded into the first insulator 11 is greater than 0.01 mm. A second transition segment 26' with increasing width extends from each of two ends of the second fixing segment 24. A second linear segment 27' further extends from each second transition segment 26'. The two second linear segments 27' are respectively connected with the positioning segment 25 and the connecting segment 23. The width of the second linear segment 27' is greater than the width of the second transition segment 26' and the width of the second fixing segment 24, and the height of the second linear segment 27' insert-molded into the second insulator 12 is greater than 0.01 mm. During molding of such a structure, a mold is used to wrap and clamp the mating segment 20 and the positioning segment 25 of the terminals 2, the linear segments 27/27' of at least one 0.01 mm are reserved, and a structure where the linear segments 27/27' are wrapped by plastic can be formed. In this way, sealing can be facilitated, which avoids the problem of impossible stripping and rough edges caused by that the plastic only wraps the transition segments 26/26' with increasing width.

In this embodiment, the width of the first fixing segment 22 and the width of the second fixing segment 24 are basically equal, the width of the first fixing segment 22 and the width of the second fixing segment 24 are both less than the width of the connecting segment 23, the width of the mating segment 20 is greater than that of the first fixing segment 22, and the width of the positioning segment 25 is greater than that of the second fixing segment 24.

The medium contacted by the mating segment 20, the connecting segment 23 and the positioning segment 25 not wrapped by plastic is the air, and the medium contacted by the first fixing segment 22 wrapped by the first insulator 11 and the second fixing segment 24 wrapped by the second insulator 12 is plastic. As the dielectric coefficient of the air is lower than that of the plastic, the width of the first fixing segment 22 and the width of the second fixing segment 24 are decreased, and impedances of the first fixing segment 22, the second fixing segment 24 and the mating segment 20, the connecting segment 23 and the positioning segment 25 connected therewith can be adjusted to be basically the same, to improve the transmission rate.

At the same time, the connecting segment 23 between the first fixing segment 22 and the second fixing segment 24 is exposed to the air, while the fixing height of the terminals 2 is ensured to be sufficient to firmly fix the terminals 2, the tapered parts of the terminals 2, that is, the length of the first fixing segment 22 and the second fixing segments 24, are shortened, to reduce the resistance of the first fixing segment 22 and the second fixing segments 24, and in addition, the medium around the connecting segment 23 is the air, therefore, insertion loss can be reduced, and high frequency performance of the electrical connection is optimized.

Figure 7:
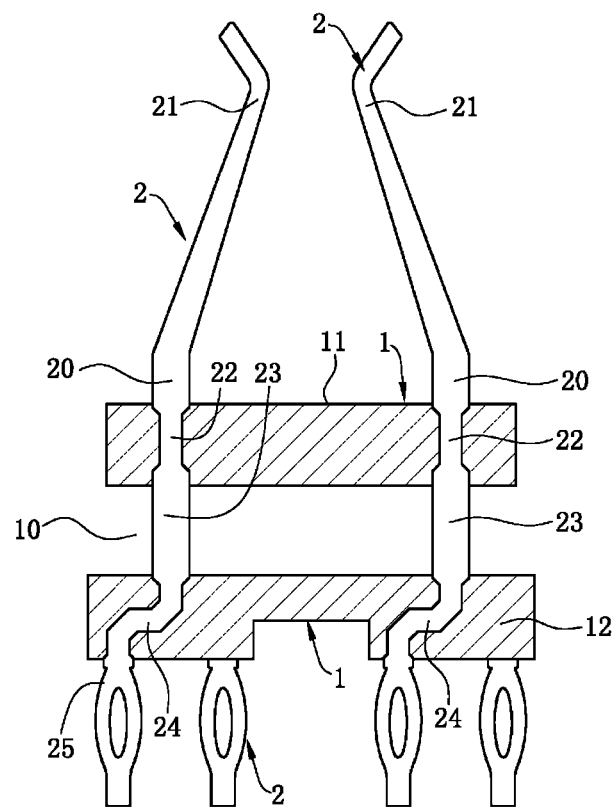
FIG. 7 is a sectional view of a second embodiment of the present invention.

A second embodiment as shown in FIG. 7 is different from the first embodiment in that: the first insulator 11 and the second insulator 12 are disposed separately.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
    an insulating body, comprising a first insulator and a second insulator, the first insulator and the second insulator having a gap space therebetween, and the gap space being filled with air; and
    a plurality of terminals disposed on the insulating body, wherein each of the terminals comprises a mating segment located above the first insulator, a first fixing segment extending downward from the mating segment and insert-molded into the first insulator, a connecting segment extending downward from the first fixing segment and exposed to the gap space, a second fixing segment extending downward from the connecting segment and insert-molded into the second insulator, and a positioning segment extending downward from the second fixing segment and located below the second insulator;
    wherein each of a width of the first fixing segment and a width of the second fixing segment is less than a width of at least one of the mating segment, the connecting segment and the positioning segment; and
    wherein a first transition segment with increasing width extends from each of two ends of the first fixing segment, a first linear segment further extends from each of the first transition segments, the two first linear segments are respectively connected with the mating segment and the connecting segment, a width of the first linear segment is greater than a width of the first transition segment and the width of the first fixing segment, and a height of the first linear segment insert-molded into the first insulator is greater than 0.01 millimeter (mm).

2. The electrical connector according to claim 1, further comprising a plurality of through holes disposed respectively through the first insulator and/or the second insulator, and each of the through holes located between two adjacent terminals.

3. The electrical connector according to claim 1, further comprising a plurality of through holes disposed respectively through the first insulator and/or the second insulator, wherein the terminals are arranged in two rows, and one of the through holes is located between any two adjacent terminals in the same row.

4. The electrical connector according to claim 1, wherein a second transition segment with increasing width extends from each of two ends of the second fixing segment, a second linear segment further extends from each of the second transition segments, the two second linear segments are respectively connected with the positioning segment and the connecting segment, a width of the second linear segment is greater than a width of the second transition segment and the width of the second fixing segment, and a height of the second linear segment insert-molded into the second insulator is greater than 0.01 mm.

5. The electrical connector according to claim 1, wherein the width of the first fixing segment and the width of the second fixing segment are both less than the width of the connecting segment.

6. The electrical connector according to claim 1, wherein the width of the mating segment is greater than that of the first fixing segment.

7. The electrical connector according to claim 1, wherein the width of the positioning segment is greater than that of the second fixing segment.

8. The electrical connector according to claim 1, wherein the first insulator and the second insulator are disposed separately.

9. The electrical connector according to claim 1, wherein the insulating body further comprises a third insulator connecting the first insulator and the second insulator, and the first insulator, the second insulator and the third insulator are integrally formed and enclose the gap space.

\* \* \* \* \*